(12) United States Patent
Jang et al.

(10) Patent No.: US 7,952,091 B2
(45) Date of Patent: May 31, 2011

(54) ORGANIC THIN FILM TRANSISTOR AND METHOD OF MANUFACTURING THE SAME

(75) Inventors: Seon-Pil Jang, Seoul (KR); Jung-Han Shin, Yongin-si (KR); Min-Ho Yoon, Seoul (KR); Seong-Sik Shin, Cupertino, CA (US); Jung-Hun Noh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 271 days.

(21) Appl. No.: 12/347,438

(22) Filed: Dec. 31, 2008
(Under 37 CFR 1.47)

(65) Prior Publication Data
US 2009/0230385 A1    Sep. 17, 2009

(30) Foreign Application Priority Data

Mar. 14, 2008    (KR) .................. 10-2008-0023970

(51) Int. Cl.
*H01L 51/00*    (2006.01)

(52) U.S. Cl. .................................. 257/40; 257/E51.006
(58) Field of Classification Search .................... 257/40, 257/E51.006; 438/99
See application file for complete search history.

(56) References Cited

U.S. PATENT DOCUMENTS 7,459,337 B2 * 12/2008 Kang et al. ..................... 438/99
* cited by examiner

*Primary Examiner* — Quoc D Hoang
(74) *Attorney, Agent, or Firm* — H.C. Park & Associates, PLC

(57) ABSTRACT

Disclosed are an organic thin film transistor and a method of manufacturing the same. The organic thin film transistor includes a gate electrode, an insulating layer, an organic semiconductor layer, a protective layer, and source and drain electrodes. The insulating layer is on the gate electrode, and the organic semiconductor layer is on the insulating layer. The protective layer is on the organic semiconductor layer, and includes an electrode pattern part to expose the organic semiconductor layer. The source and drain electrodes are in the electrode pattern part and connected to the organic semiconductor layer.

9 Claims, 5 Drawing Sheets

ORGANIC THIN FILM TRANSISTOR AND METHOD OF MANUFACTURING THE SAME

CROSS-REFERENCE TO RELATED APPLICATION

This application claims priority from and the benefit of Korean Patent Application No. 10-2008-0023970, filed on Mar. 14, 2008, which is hereby incorporated by reference for all purposes as if fully set forth herein.

BACKGROUND OF THE INVENTION

1. Field of the Invention

The present invention relates to an organic thin film transistor and a method of manufacturing the same.

2. Discussion of the Background

Flat panel displays are generally thin and driven with low voltage. Types of flat panel displays include liquid crystal displays and organic light emitting devices.

Although the flat panel displays may have various structures according to the type thereof, the flat panel displays conventionally include a thin film transistor display substrate equipped with a thin film transistor (TFT) that serves as a switching element.

The TFT includes an inorganic semiconductor or an organic semiconductor to form a channel, which is a passage for current flow between source and drain electrodes. When the TFT includes organic material to form the channel, the TFT is referred to as an organic TFT.

The organic TFT may be classified as a bottom contact type or a top contact type. In the bottom contact type organic TFT, a gate electrode is formed at a lower portion of an organic semiconductor and source and drain electrodes contact the organic semiconductor at the bottom of the organic semiconductor. In contrast, in the top contact type organic TFT, source and drain electrodes contact the organic semiconductor at the top of the organic semiconductor.

The top contact type organic TFT may be more advantageous than the bottom contact type organic TFT in terms of charge injection, so the top contact type organic TFT may ensure superior characteristics. However, with the top contact type organic TFT, forming the source and drain electrodes on the organic semiconductor may damage the organic semiconductor during the manufacturing process.

SUMMARY OF THE INVENTION

The present invention provides an organic thin film transistor.

The present invention also provides a simplified method of manufacturing the organic thin film transistor that may reduce damage to an organic semiconductor.

Additional features of the invention will be set forth in the description which follows, and in part will be apparent from the description, or may be learned by practice of the invention.

The present invention discloses an organic thin film transistor including a gate electrode, an insulating layer, an organic semiconductor layer, a protective layer, and source and drain electrodes. The insulating layer is on the gate electrode, and the organic semiconductor layer is on the insulating layer. The protective layer is on the organic semiconductor layer, and includes an electrode pattern part to expose the organic semiconductor layer. The source and drain electrodes are in the electrode pattern part and connected to the organic semiconductor layer.

The present invention also discloses a method of manufacturing a thin film transistor including forming a gate electrode on a substrate, forming an insulating layer on the gate electrode, forming an organic semiconductor layer on the insulating layer, and forming a protective layer on the organic semiconductor layer. The protective layer includes an electrode pattern part, and source and drain electrodes connected to the organic semiconductor layer are formed through the electrode pattern part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
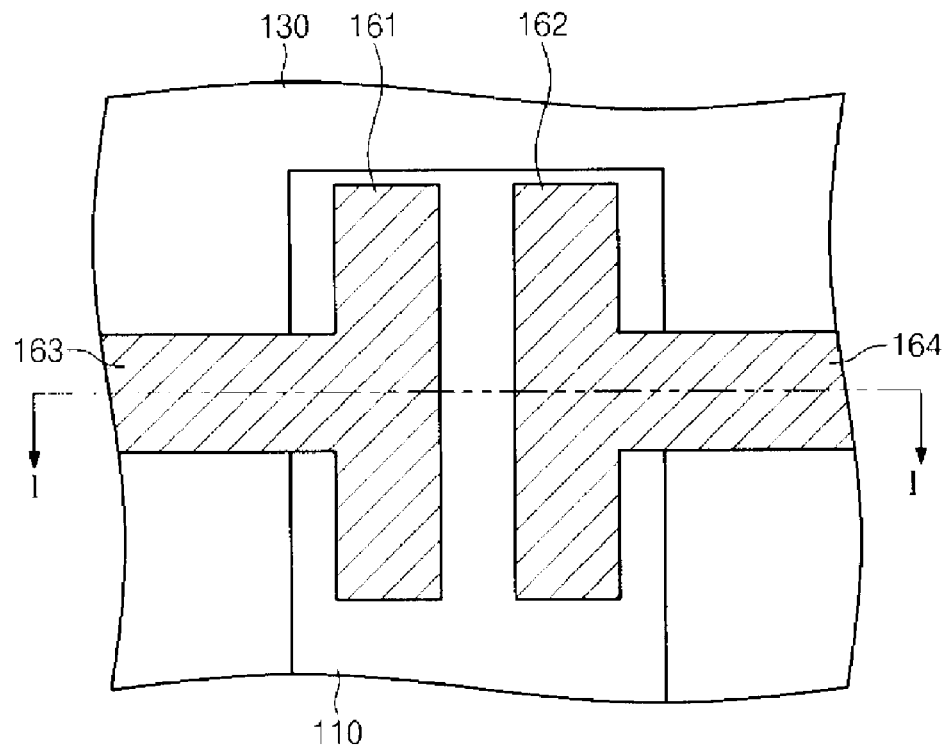
FIG. 1 is a plan view of an organic thin film transistor according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
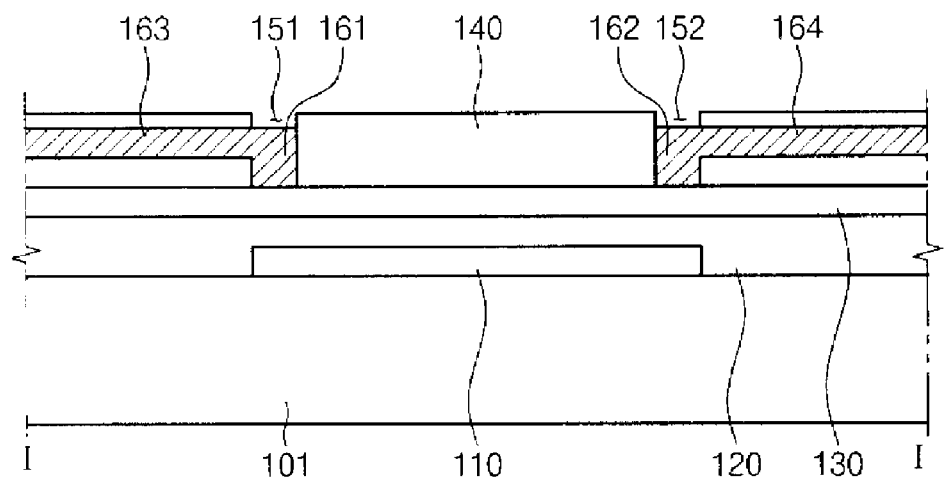
FIG. 2 is a sectional view taken along line I-I' of FIG. 1.
Figure 3:
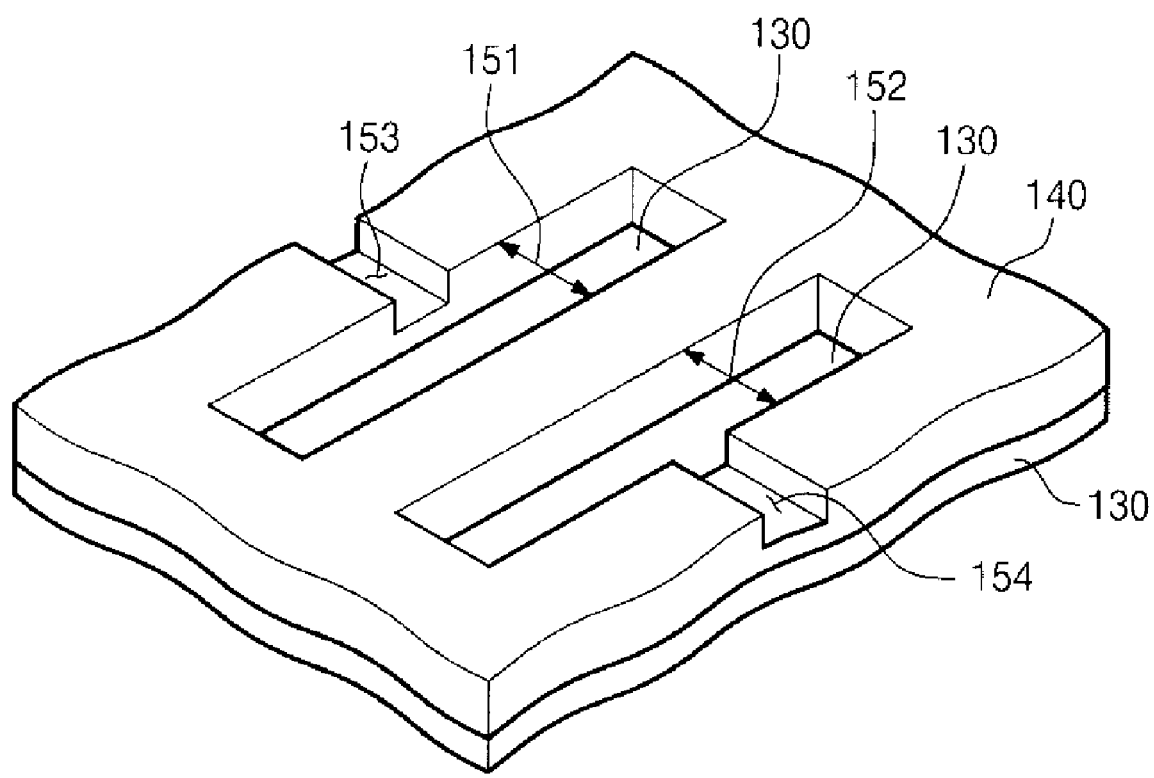
FIG. 3 is a partial perspective view of the protective layer of FIG. 2.

FIG. 1 is a plan view showing an organic thin film transistor according to an exemplary embodiment of the present invention, FIG. 2 is a sectional view showing the organic thin film transistor taken along line I-I' of FIG. 1, and FIG. 3 is a partial perspective view showing a protective layer shown in FIG. 2.

Referring to FIG. 1, FIG. 2, and FIG. 3, the organic thin film transistor according to an exemplary embodiment of the present invention includes a substrate 101, a gate electrode 110 on the substrate 101, an insulating layer 120, an organic semiconductor layer 130, a protective layer 140, a source electrode 161, and a drain electrode 162.

The substrate 101 includes an organic material or a plastic material.

The gate electrode 110 includes a conductive material. The gate electrode 110 is connected to gate lines (not shown) to receive gate signals.

The insulating layer 120 is formed on the entire surface of the substrate 101 to cover the gate electrode 110. The insulating layer 120 may include one of an organic material, an inorganic material, and a mixture of an organic material and an inorganic material.

The organic semiconductor layer 130 may be formed on the insulating layer 120 through a spin coating method or an ink-jet coating method. The organic semiconductor layer 130 may include pentacene, tetracene, anthracene, naphthalene, alpha-6-thiophene, alpha-4-thiophene, perylene, a derivative of the perylene, rubrene, a derivative of the rubrene, coronene, a derivative of the coronene, perylenetetracarboxylic diimide, a derivative of the perylenetetracarboxylic diimide, perylenetetracarboxylic dianhydride, a derivative of the perylenetetracarboxylic dianhydride, phthalocyanine, a derivative of the phthalocyanine, naphthalenetetracarboxylic diimide, a derivative of the naphthalenetetracarboxylic diimide, naphthalene tetracarboxylic dianhydride, a derivative of the naphthalene tetracarboxylic dianhydride, a conjugated polymer derivative including substituted or non-substituted thiophene, or a conjugated polymer derivative including substituted fluorene.

In addition, the organic semiconductor layer 130 may include a hydrophilic organic semiconductor material to enhance an affinity for conductive ink printed through the ink-jet coating method when the source electrode 161 and the drain electrode 162 are formed.

The protective layer 140 may be formed by coating the entire surface of the substrate 101 with an organic material to protect the organic semiconductor layer 130. In addition, the protective layer 140 may include first and second electrode pattern parts 151 and 152, and first and second interconnection pattern parts 153 and 154 branching from the first and second electrode pattern parts 151 and 152.

The first and second electrode pattern parts 151 and 152 may be formed by etching the protective layer 140 to expose a portion of the organic semiconductor layer 130. The first and second interconnection pattern parts 153 and 154 may be formed by etching the protective layer 140 to form interconnections. An exposure process using a slit may be performed with respect to the first and second interconnection pattern parts 153 and 154 such that the first and second interconnection pattern parts 153 and 154 have a step difference with respect to the first and second electrode pattern parts 151 and 152.

The protective layer 140 may include a material capable of protecting the organic semiconductor layer 130 such that the channel area of the organic semiconductor layer 130 is not damaged when a developing solution is injected to form the first and second electrode pattern parts 151 and 152 and the first and second interconnection pattern parts 153 and 154. The protective layer 140 may include an acryl-based polymer. For example, the protective layer 140 may be formed on the organic semiconductor layer 130 using an acryl-based polymer dissolved in propylene glycol methyl ether acetate. The protective layer 140 may include a hydrophobic organic material such that conductive ink used to form the source electrode 161 and the drain electrode 162 is collected in the first and second electrode pattern parts 151 and 152 and the first and second interconnection pattern parts 153 and 154.

The source and drain electrodes 161 and 162 are formed in the first and second electrode patterns 151 and 152 of the protective layer 140. Source and drain interconnections 163 and 164, which are connected to the source and drain electrodes 161 and 162 to connect a data line to a pixel electrode, are formed in the first and second interconnection pattern parts 153 and 154.

The source and drain electrodes 161 and 162 and the source and drain interconnections 163 and 164 may be formed in the first and second electrode pattern parts 151 and 152 and the first and second interconnection pattern parts 153 and 154, respectively, by printing conductive ink through an ink-jet costing method. The source and drain electrodes 161 and 162 are connected to the organic semiconductor layer 130 through the first and second electrode pattern parts 151 and 152. Thus, the source and drain electrodes 161 and 162 may be formed without damaging the organic semiconductor layer 130.

The source and drain electrodes 161 and 162 may have a top contact structure. In other words, the source and drain electrodes 161 and 162 may be formed on the organic semiconductor layer 130 while being connected to the organic semiconductor layer 130. The source and drain electrodes 161 and 162 having the top contact structure may have an expanded channel area of the organic semiconductor layer 130 as compared to source and drain electrodes 161 and 162 having a bottom contact structure in which the source and drain electrodes 161 and 162 are connected to the bottom of the organic semiconductor layer 130. The source and drain electrodes 161 and 162 having the top contact structure may be more advantageous than the source and drain electrodes 161 and 162 having the bottom contact structure in terms of charge injection, so that the characteristic of the organic thin film transistor may be more improved.

The organic thin film transistor may further include an overcoating layer (not shown) formed on the source and drain electrodes 161 and 162 and the source and drain interconnections 163 and 164. The overcoating layer includes an inorganic material or an organic material to electrically or physically protect the organic thin film transistor, and planarizes the surface of the organic thin film transistor.

Figure 4:
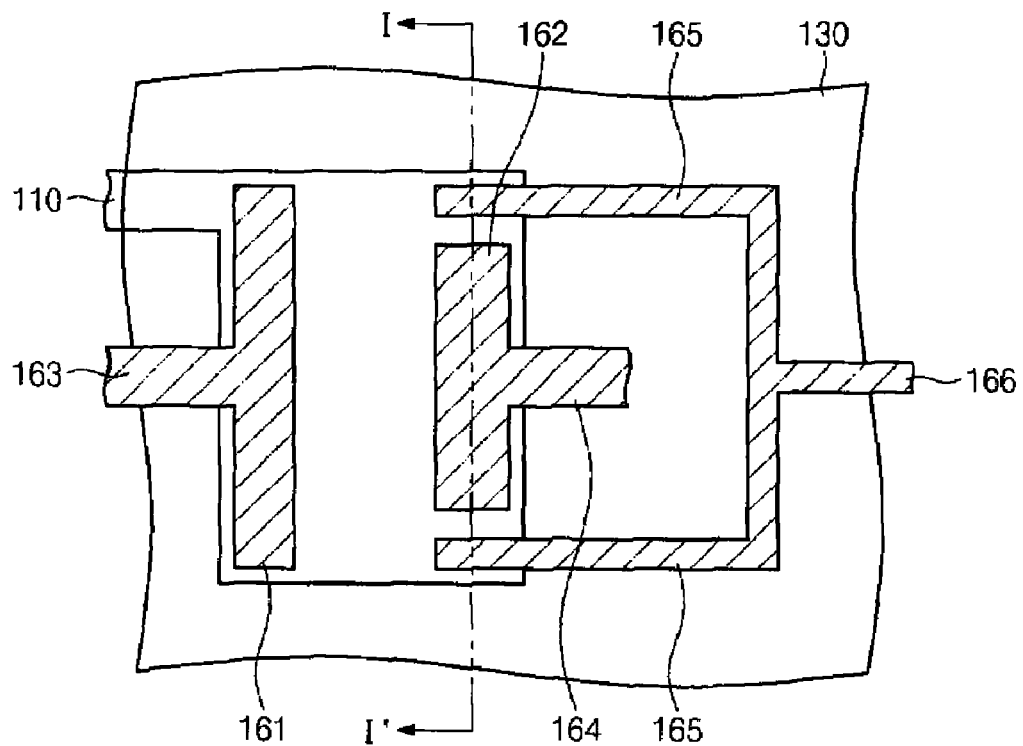
FIG. 4 is a plan view of an organic thin film transistor according to another exemplary embodiment of the present invention.
Figure 5:
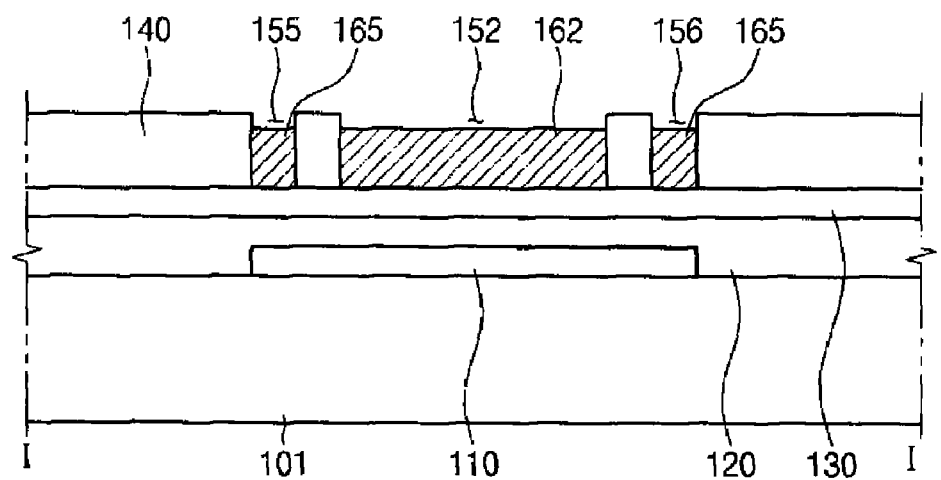
FIG. 5 is a sectional view taken along line I-I' of FIG. 4.

FIG. 4 is a plan view showing an organic thin film transistor according to another exemplary embodiment of the present invention, and FIG. 5 is a sectional view showing the organic thin film transistor taken along line I-I' of FIG. 4.

Referring to FIG. 4 and FIG. 5, the organic thin film transistor according to another exemplary embodiment of the present invention includes a substrate 101, a gate electrode 110 on the substrate 101, an insulating layer 120, an organic semiconductor layer 130, a protective layer 140, a source electrode 161, a drain electrode 162, and a collector electrode 165.

The collector electrode 165 partially overlaps the gate electrode 110, and is connected to the organic semiconductor layer 130 through third and fourth electrode pattern parts 155 and 156. The collector electrode 165 is formed at both sides of the drain electrode 162 such that the collector electrode 165 and the drain electrode 162 may face the source electrode 161 with a channel area of the organic semiconductor layer 130 therebetween. The collector electrode 165 may be aligned on the same layer with the source and drain electrodes 161 and 162 and source and drain interconnections 163 and 164. The collector electrode 165 is connected to a ground line 166.

The collector electrode 165 cuts off a current flowing from the outside of a channel of the organic semiconductor layer 130. The collector electrode 165 grounds a current introduced through a side surface of the drain electrode 162 such that a current may exclusively flow between the source and drain electrodes 161 and 162. Such a collector electrode 165 cuts off an external current to reduce current leakage, which may cause erroneous operation of the organic thin film transistor.

Figure 6:
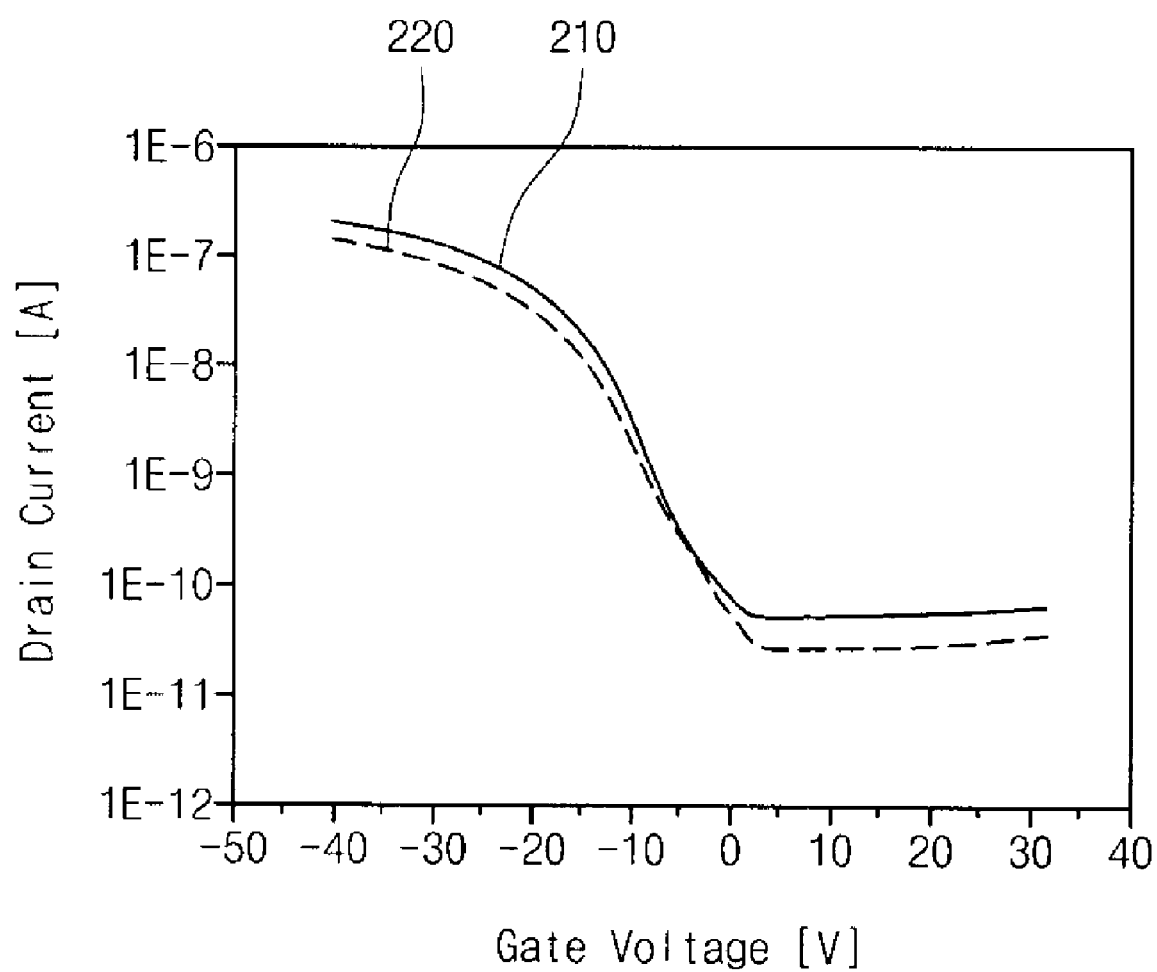
FIG. 6 is a graph showing voltage-current characteristics of organic semiconductor layers in organic thin film transistors according to the exemplary embodiments of the present invention.

FIG. 6 is a graph showing characteristic variation of the organic semiconductor layer by the protective layer 140 in the organic thin film transistor according to the first and second exemplary embodiments of the present invention. In FIG. 6, the X axis represents a gate voltage of the organic thin film transistor, and the Y axis represents a drain current of the organic thin film transistor as a function of the gate voltage.

Referring to FIG. 6, voltage-current characteristics of the organic thin film transistor are shown through first and second curves 210 and 220 before and after a developing solution is injected to form the electrode and interconnection pattern parts 151 to 154 of the protective layer 140.

In other words, the first curve 210 shows the voltage-current characteristics of the organic thin film transistor before the developing solution is injected. The second curve 220 shows the voltage-current characteristics of the organic thin film transistor after the developing solution is injected. The organic thin film transistor includes a P-type thin film transistor to output an on-current when a negative voltage is applied thereto. The organic thin film transistor may output an off-current when a positive voltage is applied thereto. In this case, a voltage of about −10 V may be applied to the drain electrode 162.

The degree to which the organic semiconductor layer 130 is protected by the protective layer 140 may be recognized by comparing the first curve 210 with the second curve 220. In detail, the protective layer 140 is formed on the organic semiconductor layer 130 to protect the organic semiconductor layer 130 from external electric influences. The protective layer 140 is formed thereon with the electrode pattern parts 151 and 152 for the connection of the source and drain electrodes 161 and 162. The protective layer 140 is subject to a development process to inject the developing solution while the interconnection pattern parts 153 and 154 are being formed. Such a protective layer 140 protects the channel area of the organic semiconductor layer 130 to prevent the channel area from being changed due to the developing solution.

According to the second curve 220, the protective layer 140 may protect the channel area of the organic semiconductor layer 130 from the developing solution to prevent the voltage-current characteristics of the organic thin film transistor from changing.

Hereinafter, a method of manufacturing the organic thin film transistor according to an exemplary embodiment of the present invention will be described with reference to FIG. 7 and FIG. 8.

Figure 7:
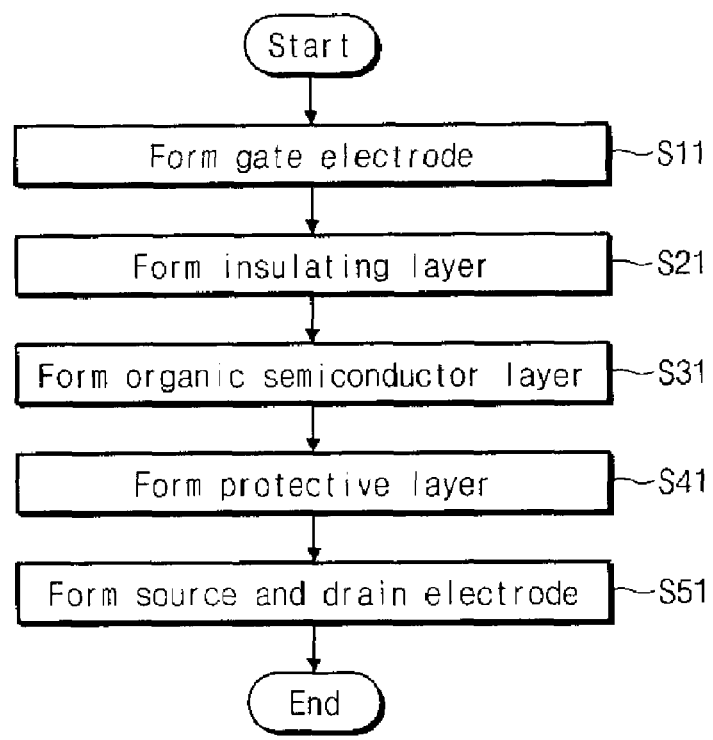
FIG. 7 is a flowchart showing a method of manufacturing an organic thin film transistor according to an exemplary embodiment of the present invention.

FIG. 7 is a flowchart showing a method of manufacturing the organic thin film transistor according to an exemplary embodiment of the present invention.

Referring to FIG. 7, in order to manufacture the organic thin film transistor, the gate electrode 110 is formed (S11). The insulating layer 120 is formed (S21). The organic semiconductor layer 130 is formed (S31). The protective layer 140 is formed (S41). The source and drain electrodes 161 and 162 are formed (S51).

Figure 8:
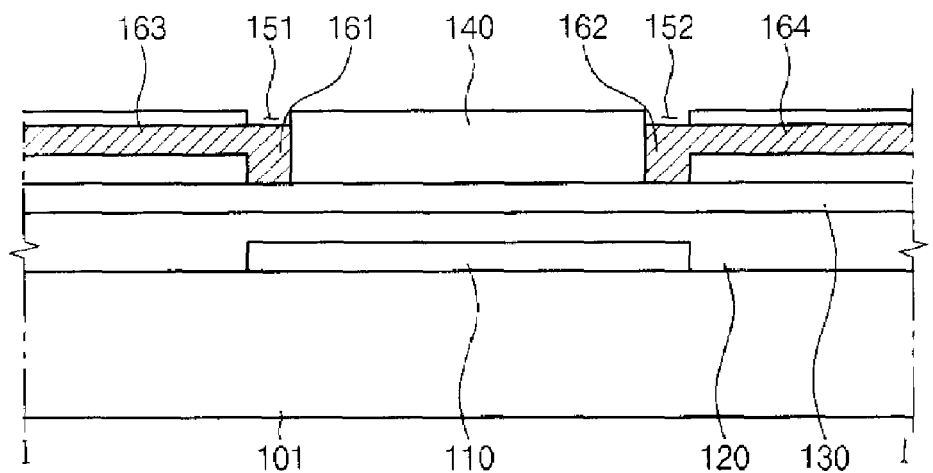
FIG. 8 is a sectional view showing a method of manufacturing the organic thin film transistor shown in FIG. 7.

FIG. 8 is a sectional view showing the method of manufacturing the organic thin film transistor shown in FIG. 7.

Referring to FIG. 8, the gate electrode 110 may be formed through exposure and etching processes after depositing a gate metal layer on the substrate 101 through a sputtering method (S11).

Next, the insulating layer 120 is formed by depositing one of an organic material, an inorganic material, and a mixture of an organic material and an inorganic material on the substrate 101 formed with the gate electrode 110 (S21).

The organic semiconductor layer 130 may be formed by coating the insulating layer 120 with an organic semiconductor material through a spin coating method or an ink-jet coating method (S31). The organic semiconductor layer 130 may include organic materials described above with reference to FIG. 1, FIG. 2, and FIG. 3. In addition, the organic semiconductor layer 130 may include a hydrophilic organic semiconductor material to enhance an affinity for the source and drain electrodes 161 and 162 that are formed in the following steps.

Then, the protective layer 140 may be formed by coating the entire surface of the substrate 101 including the organic semiconductor layer 130 with an organic material (S41). For example, the protective layer 140 may be formed by coating the organic semiconductor layer 130 with an acryl-based polymer after dissolving the acryl-based polymer in propylene glycol methyl ether acetate.

Next, the first and second electrode pattern parts 151 and 152 and the first and second interconnection pattern parts 153 and 154 branching from them are formed on the protective layer 140. In this case, the first and second electrode pattern parts 151 and 152 are formed by completely removing corresponding portions of the protective layer 140 through exposure and etch processes, and the first and second interconnection pattern parts 153 and 154 may be formed by partially removing corresponding portions of the protective layer 140 through exposure and etching processes using a slit. Meanwhile, third and fourth electrode pattern parts and interconnection pattern parts branching from them may be formed in the vicinity of the second electrode pattern part 152.

The source and drain electrodes 161 and 162 and the source and drain interconnections 163 and 164 may be formed by printing conductive ink on the first and second electrode pattern parts 151 and 152 and the first and second interconnection pattern parts 153 and 154 through an ink-jet coating method (S51). In addition, a collector electrode and a grounding line may be further formed by printing conductive ink on the third and fourth electrode pattern parts and the interconnection pattern parts branching from the third and fourth electrode pattern parts.

Meanwhile, the overcoating layer including an inorganic material or an organic material may be further formed on the source and drain electrodes 161 and 162.

According to the organic thin film transistor and the manufacturing method thereof, the manufacturing process for the organic thin film transistor may be simplified, and the damage of an organic semiconductor may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents

What is claimed is:

1. An organic thin film transistor, comprising:
a gate electrode;
an insulating layer on the gate electrode;
an organic semiconductor layer on the insulating layer;

a protective layer on the organic semiconductor layer, the protective layer comprising an electrode pattern part to expose the organic semiconductor layer; and a source electrode and a drain electrode in the electrode pattern part and connected to the organic semiconductor layer, wherein the protective layer further comprises an interconnection pattern part branching from the electrode pattern part.

2. The organic thin film transistor of claim 1, wherein the protective layer comprises an acryl-based polymer.

3. The organic thin film transistor of claim 2, wherein the interconnection pattern part has a step difference with respect to the electrode pattern part.

4. The organic thin film transistor of claim 2, further comprising an interconnection on the interconnection pattern part, the interconnection being connected to the source electrode and the drain electrode.

5. The organic thin film transistor of claim 4, wherein the source electrode, the drain electrode, and the interconnection comprise a conductive ink.

6. The organic thin film transistor of claim 5, wherein the organic semiconductor layer and the protective layer comprise a hydrophilic material and a hydrophobic material, respectively.

7. The organic thin film transistor of claim 1, further comprising a collector electrode connected to the organic semiconductor layer.

8. The organic thin film transistor of claim 7, wherein the collector electrode is arranged at opposite sides of the drain electrode to face the source electrode.

9. The organic thin film transistor of claim 1, further comprising an overcoating layer on the source electrode and the drain electrode.

* * * * *